(12) United States Patent
Beigel et al.

(10) Patent No.: US 6,954,126 B2
(45) Date of Patent: Oct. 11, 2005

(54) LEAD-LESS SURFACE MOUNT REED RELAY

(75) Inventors: John Beigel, North Falmouth, MA (US); Gunther Samuel, Mashpee, MA (US); John Boyington, Jr., Plymouth, MA (US)

(73) Assignees: Meder Electronic, Inc., Mashpee, MA (US); Meder Electronic AG, Engen-Welschingen (DE)

( * ) Notice: Subject to any disclaimer, the term of this patent is extended or adjusted under 35 U.S.C. 154(b) by 0 days.

(21) Appl. No.: 10/391,217

(22) Filed: Mar. 18, 2003

(65) Prior Publication Data

US 2003/0234709 A1 Dec. 25, 2003

Related U.S. Application Data

(63) Continuation of application No. PCT/US01/29056, filed on Sep. 18, 2001.
(60) Provisional application No. 60/233,594, filed on Sep. 18, 2000.

(51) Int. Cl.[7] .............................................. H01H 51/00
(52) U.S. Cl. ...................................... 335/151; 174/260
(58) Field of Search ............................... 361/767–768, 361/818–819; 335/151–154; 174/260–264

(56) References Cited

U.S. PATENT DOCUMENTS

| | | | |
|---|---|---|---|
| 2,869,041 A | 1/1959 | De Cola ..................... 317/101 |
| 3,038,976 A | 6/1962 | Koda ........................... 200/87 |
| 3,114,807 A | 12/1963 | Koda ........................... 200/87 |
| 3,480,836 A | 11/1969 | Aronstein ................... 317/100 |
| 3,575,678 A | 4/1971 | Barton ........................ 335/151 |
| 4,254,448 A | 3/1981 | Martyniak ................... 361/409 |
| 4,286,241 A | 8/1981 | Olivenbaum et al. ........ 335/151 |
| 4,361,862 A | 11/1982 | Martyniak ................... 361/404 |
| 4,480,384 A | 11/1984 | Bolzt et al. ................... 29/840 |
| 4,542,439 A | 9/1985 | Dick ........................... 361/405 |
| 4,571,794 A | 2/1986 | Nakamura ................. 29/25.35 |
| 4,933,655 A | 6/1990 | Matsubara ................... 335/205 |
| 5,386,343 A | 1/1995 | Pao ............................. 361/761 |
| 5,541,450 A | 7/1996 | Jones et al. ................. 257/697 |
| 5,943,216 A | 8/1999 | Schmidt ..................... 361/761 |
| 5,963,116 A | * 10/1999 | Endoh et al. ............... 335/151 |
| 5,994,648 A | 11/1999 | Glovatsky et al. .......... 174/260 |
| 5,999,412 A | 12/1999 | Busse et al. ................ 361/761 |
| 6,025,768 A | 2/2000 | Martich ....................... 335/152 |
| 6,040,748 A | 3/2000 | Gueissaz ...................... 335/78 |
| 6,052,045 A | 4/2000 | Martich ....................... 335/151 |
| 6,104,267 A | 8/2000 | Palmer et al. .............. 335/151 |
| 6,154,370 A | 11/2000 | Degani et al. .............. 361/761 |
| 6,239,977 B1 | 5/2001 | Price et al. ................. 361/737 |
| 6,246,013 B1 | 6/2001 | Yoshida et al. ............. 174/260 |
| 6,294,971 B1 | * 9/2001 | Martich ....................... 335/151 |

OTHER PUBLICATIONS

International Search Report based on PCT/US01/29056.

* cited by examiner

*Primary Examiner*—Lincoln Donovan
(74) *Attorney, Agent, or Firm*—Palmer & Dodge, LLP; Richard B. Smith; David J. Dykeman (57) ABSTRACT

A reed relay or reed sensor device that is substantially lead-less and has minimal inductance can be manufactured as an individual unit or as a plurality of units. The reed relay or reed sensor device comprises a substrate that has a plurality contacts on the exterior of the device connected to contacts on the interior of the device capable of maintaining a signal pathway to the internal components of the device. The internal components further comprise a reed switch, an electrical shield, a coil bobbin, and a coil of electrical wire which when energized is capable of effectuating switching in the reed relay.

23 Claims, 12 Drawing Sheets

LEAD-LESS SURFACE MOUNT REED RELAY

RELATED APPLICATIONS

This is a continuation of PCT Application Serial Number PCT/US01/29056, filed Sep. 18, 2001, which claims the benefit of U.S. Provisional Application Ser. No. 60/233,594, filed Sep. 18, 2000, the entirety of all these applications are hereby incorporated herein by reference.

FIELD OF THE INVENTION

The present invention relates generally to switching devices. More specifically the present invention relates to a surface mount reed relay or reed sensor that is substantially lead-less, thereby minimizing the signal path and maximizing the frequency response. The resulting inductance and distributed capacitance are significantly lowered, thereby enabling a higher frequency response in the reed switch. The invention also relates to a method of making reed relay components, and arrays of these components.

BACKGROUND OF THE INVENTION

Electromagnetic relays have been known in the electronics industry for many years. Such electromagnetic relays include the reed relay, which incorporates a reed switch. A reed switch is a magnetically activated device that typically includes two flat contact tongues that are merged in a hermetically sealed glass tube filled with a protective inert gas or vacuum. The switch is operated by an externally generated magnetic field, either from a coil or a permanent magnet. When the external magnetic field is enabled, the overlapping contact tongue ends attract each other and ultimately come into contact to close the switch. When the magnetic field is removed, the contact tongues demagnetize and spring back to return to their rest positions, thus opening the switch like member. A coil of wire is wrapped about the outside of the bobbin and connected to a source of electric current. The current flowing through the coil creates the desired magnetic field to actuate the reed switch contained within the bobbin housing. Some applications of reed devices require the switch to carry signals with frequencies in excess of 500 MHz. For these applications, a ground shield conductor, commonly made of copper, or brass or any suitably conductive metals is disposed about the body of the reed switch. The ground shield conductor is commonly in a cylindrical configuration. The shield conductor resides between the reed switch and the bobbin housing to form a co-axial high frequency transmission system. This co-axial system includes the outer shield conductor and the switch lead signal conductor co-axially through the center of the reed switch. The ground shield conductor is employed to contain the signal through the switch conductor in order to maintain the desired impedance of the signal path. For application at higher frequencies, a reed switch device must be ideally configured to match as closely as possible the desired impedance requirements of the circuit in which it is installed.

Within a circuit environment, a co-axial arrangement is preferred throughout the entire environment to maintain circuit integrity and the desired matched impedance. As stated above, the body of a reed switch includes the necessary coaxial environment. In addition, the signal trace on the user's circuit board commonly includes a "wave guide" where two ground leads reside on opposing sides of the signal lead and in the same plane or a "strip line" where a ground plane resides below the plane of the signal conductor. These techniques properly employed provide a two-dimensional co-axial-like environment, which is acceptable for maintaining the desired impedance for proper circuit function.

However, the reed switch device must be physically packaged and electrically interconnected to a circuit board carrying a given circuit configuration. It is common to terminate the shield and signal terminals to a lead frame architecture and enclose the entire assembly in a dielectric material like plastic for manufacturing and packaging ease. These leads may be formed in a gull-wing or "J" shape for surface mount capability. The signal leads or terminals exit out of the reed switch body and into the air in order to make the electrical interconnection to the circuit board. This transition of the signal leads from plastic dielectric to air creates an undesirable discontinuity of the protective co-axial environment found within the body of the switch itself. Such discontinuity creates inaccuracy and uncertainty in the impedance of the reed switch device. As a result, circuit designers must compensate for this problem by specifically designing their circuits to accommodate and anticipate the inherent problems associated with the discontinuity of the protective co-axial environment and the degradation of the rated impedance of the reed switch device. For example, the circuit may be tuned to compensate for the discontinuity by adding parasitic inductance and capacitance. This method of discontinuity compensation is not preferred because it complicates and slows the design process and can degrade the integrity of the circuit. There is a demand to reduce the need to tune the circuit as described above.

Generally, highly conductive materials are used to construct the signal leads in order to minimize impedance through the leads, thereby reducing the buildup of heat as well as preventing degradation of signal quality. However, the problem of inductance is not addressed by the composition of the leads. Inductance occurs when a magnetic field is created in response to the propagation of a current in one direction through a signal path, which sets up an opposing current in the signal path. Unwanted inductance in the signal path can degrade the high frequency capability of the circuit. This effect can be compensated for to a limited degree. As the frequency of the signal increases, inductance becomes an increasing problem, even with signal compensation. This property places practical constraint on the frequencies used, and thereby constrains the bandwidth of the device.

As consumer and industry demands for faster signal processing, increased bandwidth, and smaller component profiles increase, there exists a demand for small electronic devices that can operate into the microwave region of signal frequencies without a decrease in signal quality. More specifically, what is needed are compact devices that are capable of conducting very high frequency signals with little to no loss in signal quality.

SUMMARY OF THE INVENTION

The present invention provides an electromagnetic reed switch device, such as a reed relay or a reed sensor, for use in applications that require microwave signal switching and/or very small component profiles. The reed relay switches and reed sensors are smaller, easier to manufacture, and can be fabricated in close-packed arrays which can be supplied individually or as multiple units. The invention can be surface mounted on a circuit board using conventional surface mount technologies and materials, thereby facilitating the manufacture of components that incorporate the invention.

A reed switch device is disclosed that includes a reed switch with at least one electrical signal path. A cylindrical ground shield is provided about the reed switch. Ground terminals are connected to opposing sides of the ground shield so that the ground terminals are on opposing sides of the signal terminal and lie in the same plane. The reed switch resides on a support substrate. An electrically conductive signal path extends through said main body and connects to the signal terminals. Ground paths extend through the main body and respectively connect to the ground terminals. The ground paths are on opposing sides of the signal path and lie in the same plane as the signal path. The signal and ground paths exit the main body and are connected to a circuit to provide a compact surface mount package with a controlled impedance environment.

The invention employs a substantially lead-less design that reduces the profile of the component and substantially reduces unwanted inductance. As such, the present invention can be used to switch high frequency signals with greatly improved frequency response. More specifically, the invention enables the ability of the device to switch fast digital pulses at microwave frequencies with shorter or smaller signal paths. Additionally the ability to manufacture the component in modules or arrays allows for inexpensive production of single devices and production of relay array devices with multiple switching nodes.

It is therefore an object of the present invention to provide a compact reed switch package with a small footprint.

It is an object of the present invention to provide a reed switch device with a controlled impedance environment throughout the entire package that is easily matched to the impedance of an existing circuit environment.

Another object of the present invention is to provide a substantially lead-less reed switch package that is capable of efficiently conducting high frequency signals.

It is a further object of the present invention to provide a reed switch package that is inexpensive to manufacture.

DETAILED DESCRIPTION OF THE INVENTION

Figure 1:
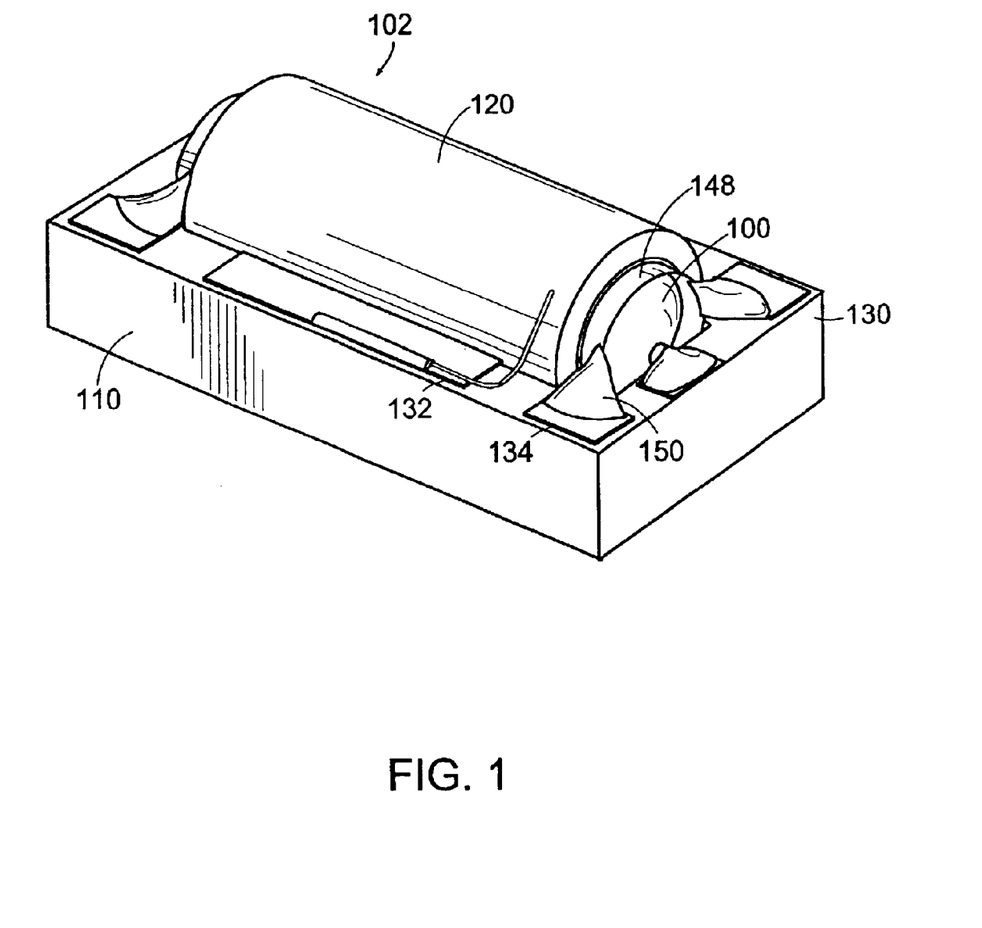
FIG. 1 is a view of the reed switch disposed on the substrate, with the over mold not shown so as to reveal the internal switch component.

The novel features characteristic of the present invention are set forth in the appended claims. However, the inventions preferred embodiments, together with further objects and attendant advantages will be best understood by reference to the following detailed description taken in connection with the accompanying drawings, intended to be exemplary only, in which:

FIG. 1 shows the present reed switch device, as a single unit. The device as shown does not include the thermoformed over mold matrix, which would cover the internal reed switch component in the finished product. The substrate 110 defines an open aperture capable of receiving the internal component 102. The internal component as shown further comprises a reed switch 100, an electrical shield 148 substantially surrounding the reed switch, and a coil assembly 120 further comprising a coil of electrical wire wound around a coil bobbin, wherein the coil is capable of being electromagnetically energized and thus causing activation of the reed switch. The internal component 102 is seated within the substrate 110, and the component 102 is terminated to a plurality of contacts 130, 132 and 134 by any means of electrically connecting two conductors, for example, conductive epoxy, conductive paste, solder, or a weld, shown as 150. The coil assembly 120 and shield 148 are likewise terminated to contacts 132 and 134 on the substrate.

Figure 2A:
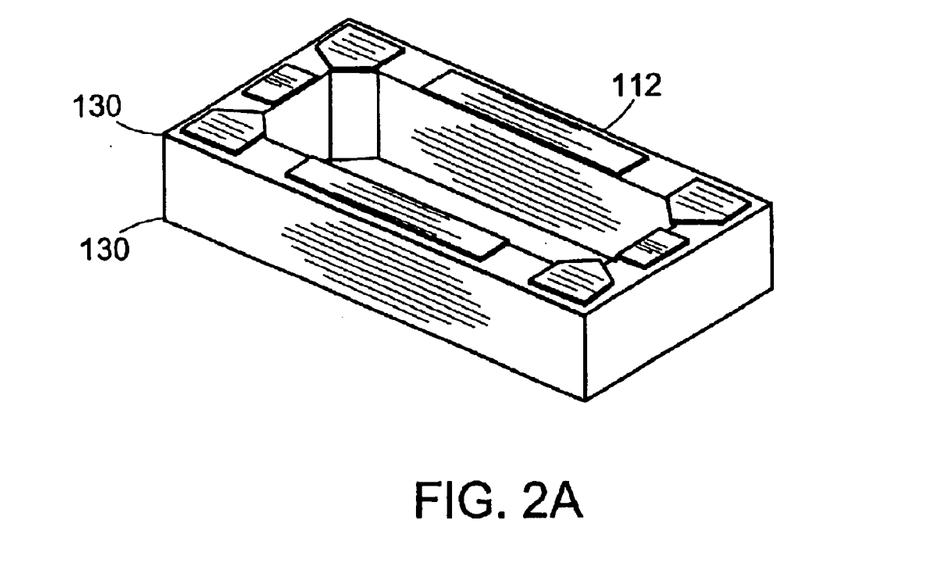
FIG. 2 shows two embodiments of the substrate, a hollow substrate with an open bottom and a hollow substrate with a closed bottom. The switch contacts are shown in both embodiments.

FIG. 2A shows an open bottom embodiment of the substrate 112. The substrate provides a structure of a length and thickness capable of receiving and containing one or more internal components (not shown). The interior of the substrate defines a hollow space for the internal components, and the exterior of the substrate defines a plurality of exterior surfaces. Contacts capable of providing a electrically conductive path, are shown as 130. In this embodiment the contacts 130 display some relief, and do not extend to the exterior edge of the substrate. The contacts 130 on the top surface of the substrate as shown are intended to be connected to the internal components of the reed switch (not shown). In this embodiment, another set of contacts are presented on the bottom surface of the substrate (not shown). The bottom contacts provide for surface mount electrical connections with the circuit board incorporating the reed switch. Connection between the interior contacts and the exterior contacts is effectuated by forming holes in the substrate and filling or plating the holes with a conductive substance, thereby forming electrically conductive vias through the substrate (not shown).

Figure 2B:
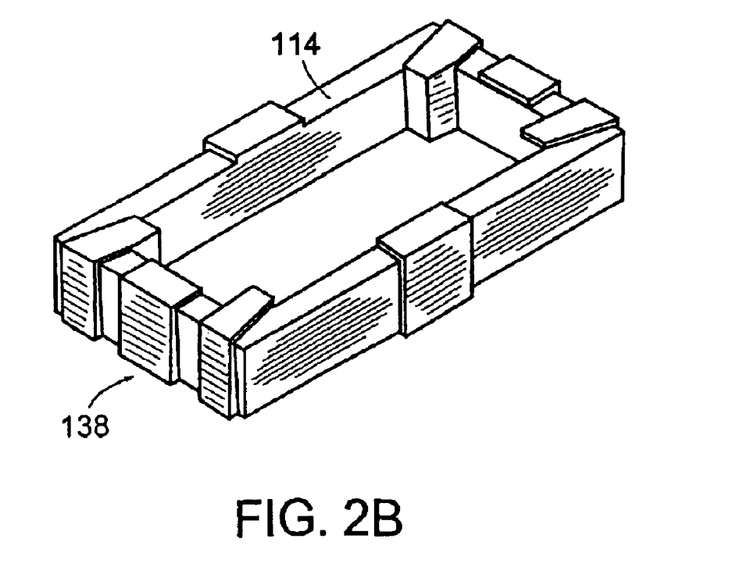

In another embodiment shown as FIG. 2B, the substrate 114 is closed on the bottom surface, and again provides a structure of a length and thickness sufficient to receive and contain the internal components (not shown). Herein, the substrate comprises a depression capable of receiving the internal component. The depression defines a plurality of interior surfaces of the substrate, as well as the opposing exterior bottom surface, and exterior side surfaces. Internal contacts provide a conductive path from a plurality of exterior contacts, to the interior contact surfaces to which the internal components are terminated (not shown). In this embodiment, an electrical connection between the interior and exterior contacts is effectuated by way of electrically conductive traces or terminals 138, which extend along the outside surface of the substrate.

Figure 3A:
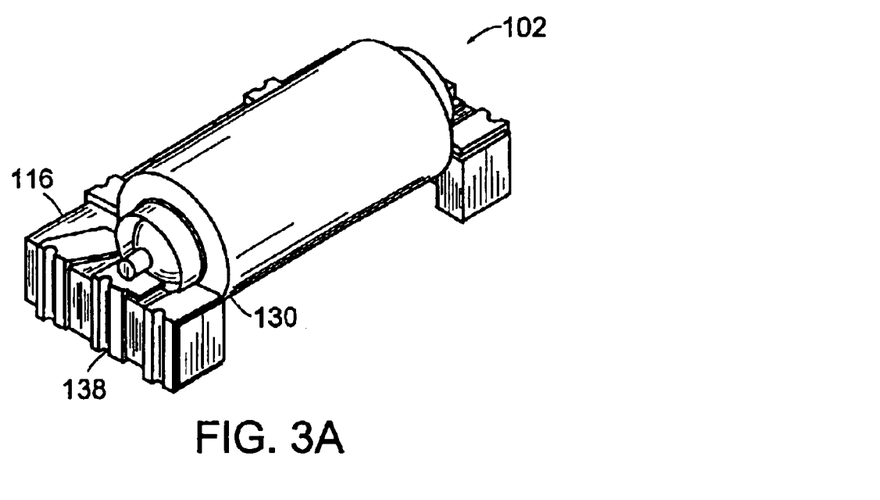
FIG. 3 shows one embodiment of the substrate with an open sided design, and another embodiment where the substrate is substantially thin. The reed switch internal component is shown in both illustrations.

FIG. 3A shows an embodiment wherein the substrate 116 defines a structure similar to FIG. 2, but is open on one side. The contacts 130 engage the internal component 102 and are electrically connected to terminals 138, thereby providing a conductive pathway over the surface of the substrate 116.

Figure 3B:
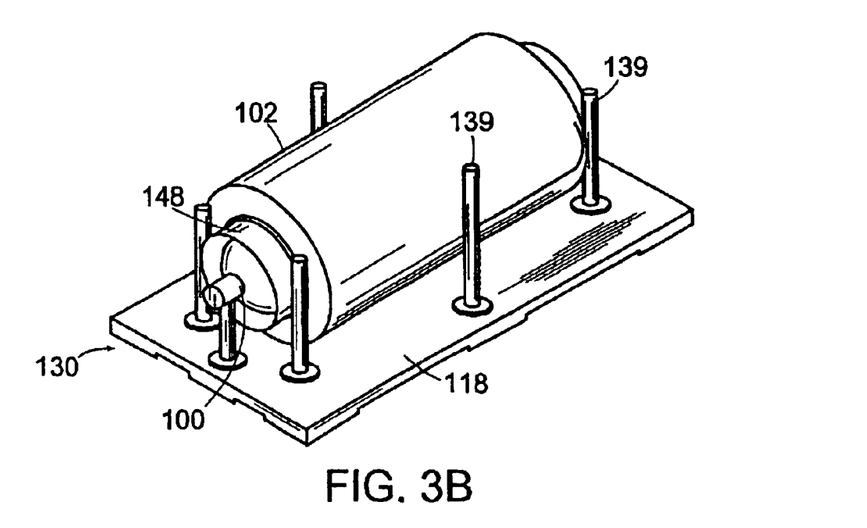

FIG. 3B shows an embodiment wherein the substrate 118 is substantially thin. A plurality of pins 139 are terminated to the internal component 102, thereby constraining the internal component 102 on the substrate 118. The pins 139 extend through the substrate 118, and are terminated to the external contacts 130 thereby providing a plurality of electrically conductive pathways from the external surface of the reed switch module to the internal component 102.

Figure 4A:
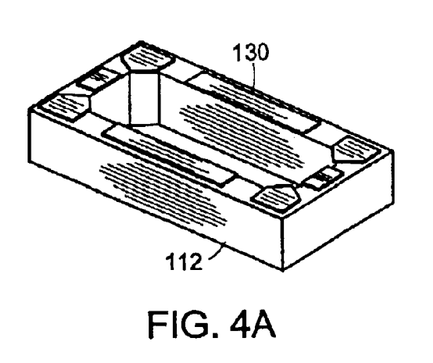
FIG. 4 shows several embodiments whereby an electrically conductive signal path is effectuated through or over the substrate.
Figure 4B:
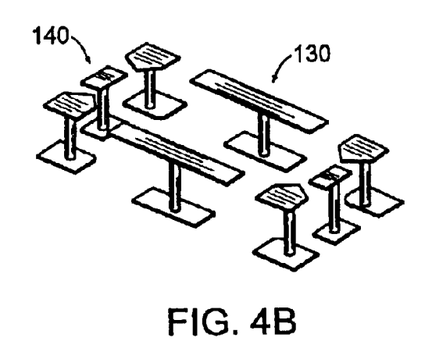
Figure 4C:
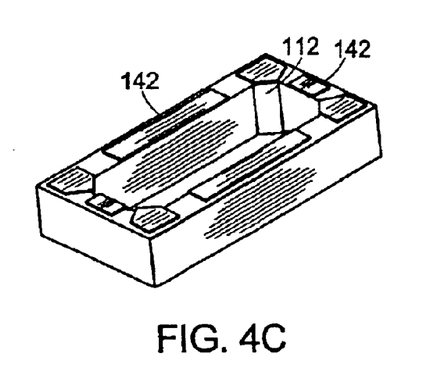
Figure 4D:
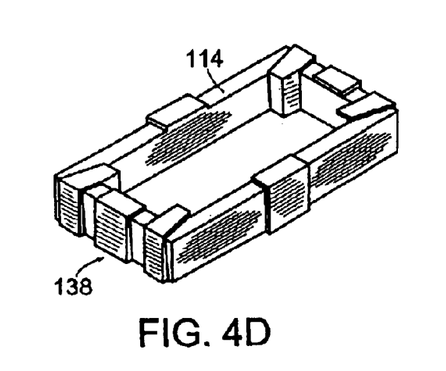
Figure 4E:
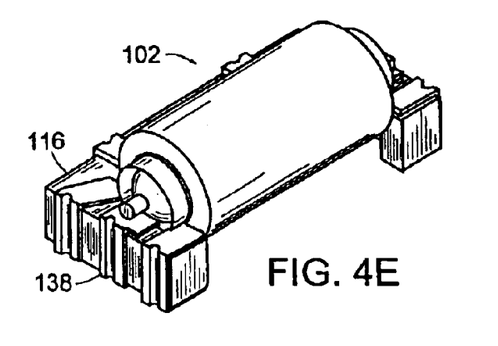

FIG. 4A shows an embodiment wherein the reed switch further comprises an open bottom substrate 112 defining a hollow aperture capable of receiving and containing the internal component. A number of contacts 130 are shown. FIG. 4B illustrates this embodiment, but omits the substrate from the view. The contacts 130 shown in this view are the internal contacts on the surface of the substrate that will be connected to the internal component, and external contacts that will allow for conductive surface mounting of the device on a circuit board. The internal and external contacts are connected by conductors, or vias 140, which extend though a plurality of plated through holes in the substrate, and provide a conductive pathway through the non-conductive substrate material. FIG. 4C illustrates that the vias 142 that extend through the plated through holes may be exposed on one or more surfaces of the substrate. FIG. 4D further illustrates that the electrically conductive path may be in the form of terminals 138, exposed on a plurality of exterior surfaces of the substrate. FIG. 4E illustrates that the terminals 138 provide a conductive pathway to the internal component 102 along a substrate 116 open on a plurality of surfaces.

Figure 5:
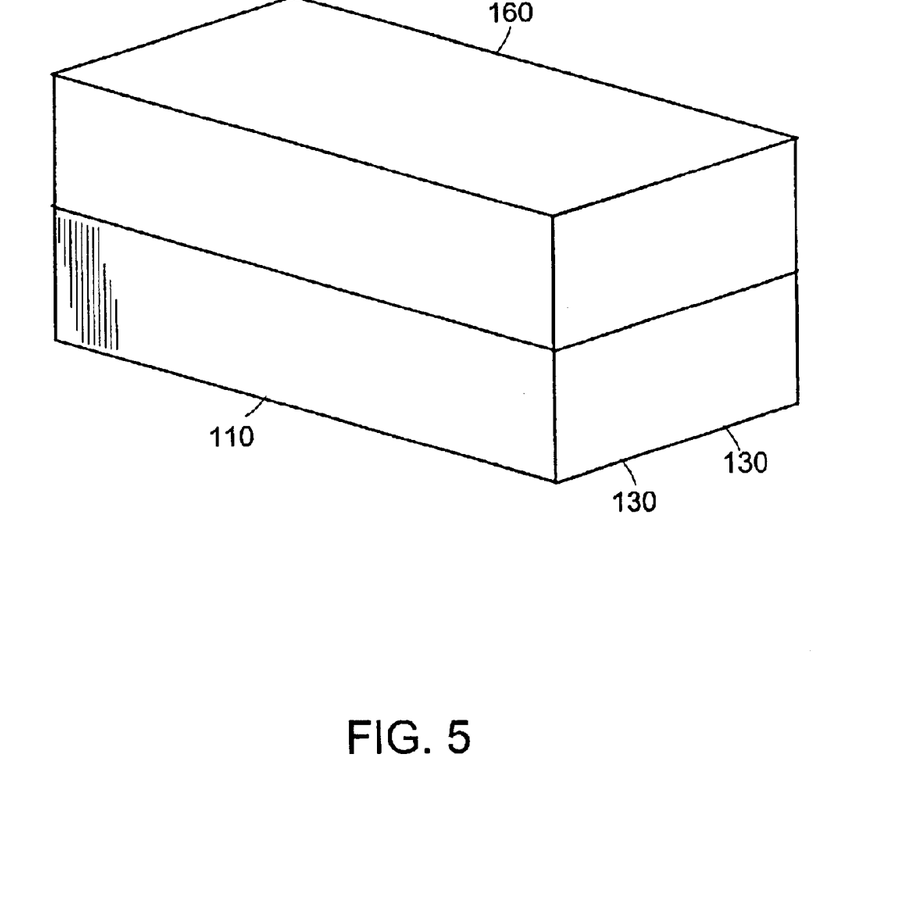
FIG. 5 shows a finished reed switch, with the internal switch component encased in an over mold.

FIG. 5 shows a finished surface mount reed switch module. The finished reed relay module is a substantially lead-less design capable of surface mounting to, for example, a circuit board. The lead-less design results in a more compact structure, reducing the footprint of the module and virtually eliminating package lead inductance. The module as shown comprises a substrate 110 with contacts 130 visible on the bottom surface of the module. The contacts as shown 130 are the external contacts, which provide an electrical path from the circuit board to the internal components of the module. The internal contacts and internal components are not shown in this figure. An over mold 160 comprising a thermoplastic material, engages the substrate and provides a plurality of exterior surfaces further defining the monolithic structure of the module. The over mold 160 also encases the internal components of the module.

Figure 6:
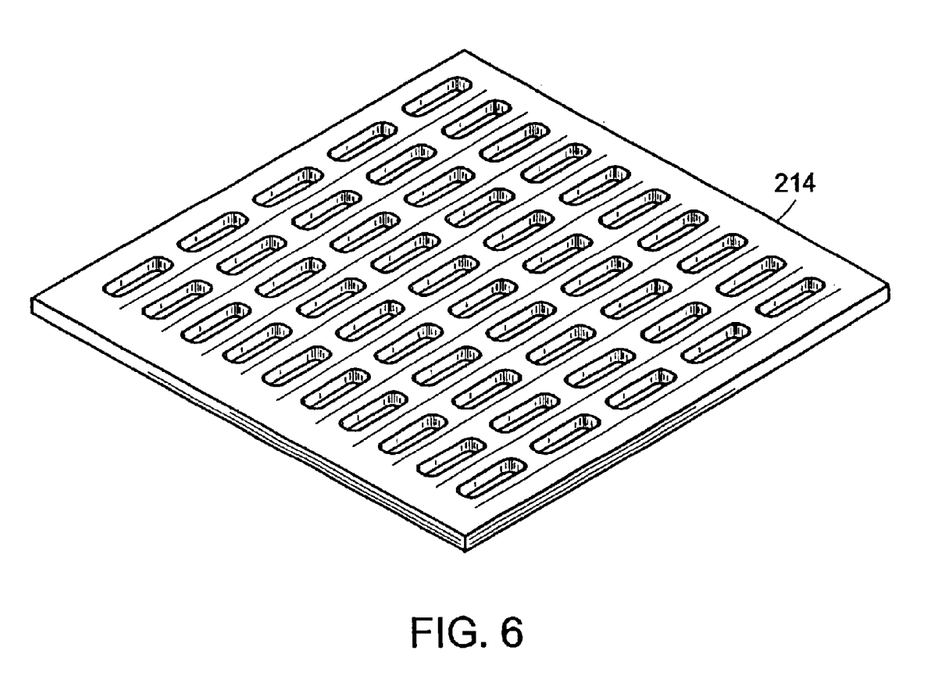
FIG. 6 shows a substrate array capable of receiving 50 reed switch components.
Figure 7:
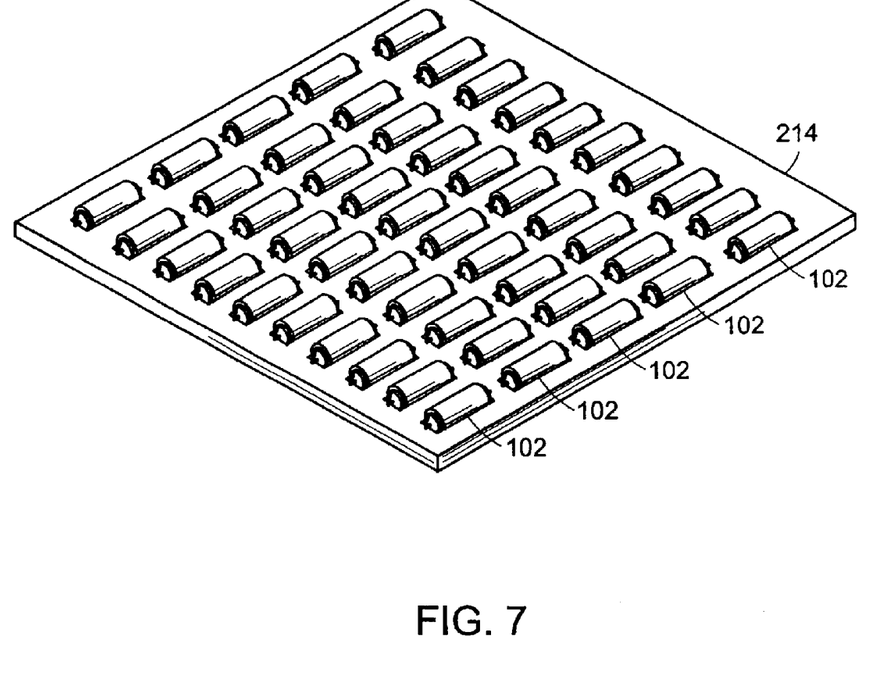
FIG. 7 shows the substrate array of FIG. 6 with the 50 reed switch components inserted into the substrate array and terminated to electrically conductive signal pathways.
Figure 8:
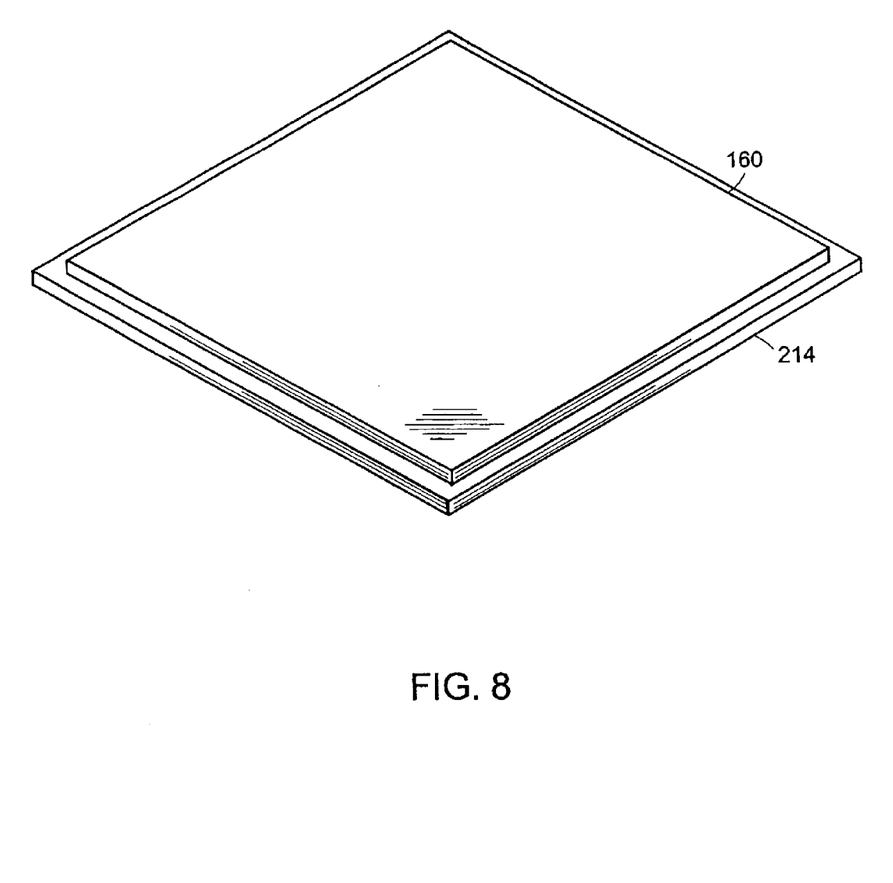
FIG. 8 shows the 50 switch matrix illustrated in FIG. 6 and FIG. 7 with the internal component switches encased in a thermoset over mold.

FIG. 6 shows one embodiment of the invention wherein the substrate is manufactured to provide for a plurality of internal components. Shown in this illustration is a ceramic substrate 214 manufactured in a 5×10 matrix in a closed bottom configuration capable of receiving and containing 50 reed switch devices (not shown). In this embodiment, the substrate 214 has dimensions of 50.8 mm by 50.8 mm (2×2"), which will be the approximate footprint of the finished 50-switch module. FIG. 7 shows the 50 reed switch module embodiment with the internal components 102 disposed on the substrate 214 and terminated as described. FIG. 8 shows the same 50-switch embodiment wherein a thermoset over mold 160 is applied, and is offset from the edges of the substrate 214. In one embodiment the reed switch module is diced to create 50 individual reed switch modules. In another embodiment, the reed switch module is diced to create module comprising an array of reed switches, for example a 1×5 array, a 1×10 array, a 2×10 array, a 3×8 array, a 5×5 array, or the like. In yet another embodiment, the 50-switch array is used as a single module. The number of switches in a finished module will be determined by the specifications of the application and the desired footprint on the circuit board.

Figure 9:
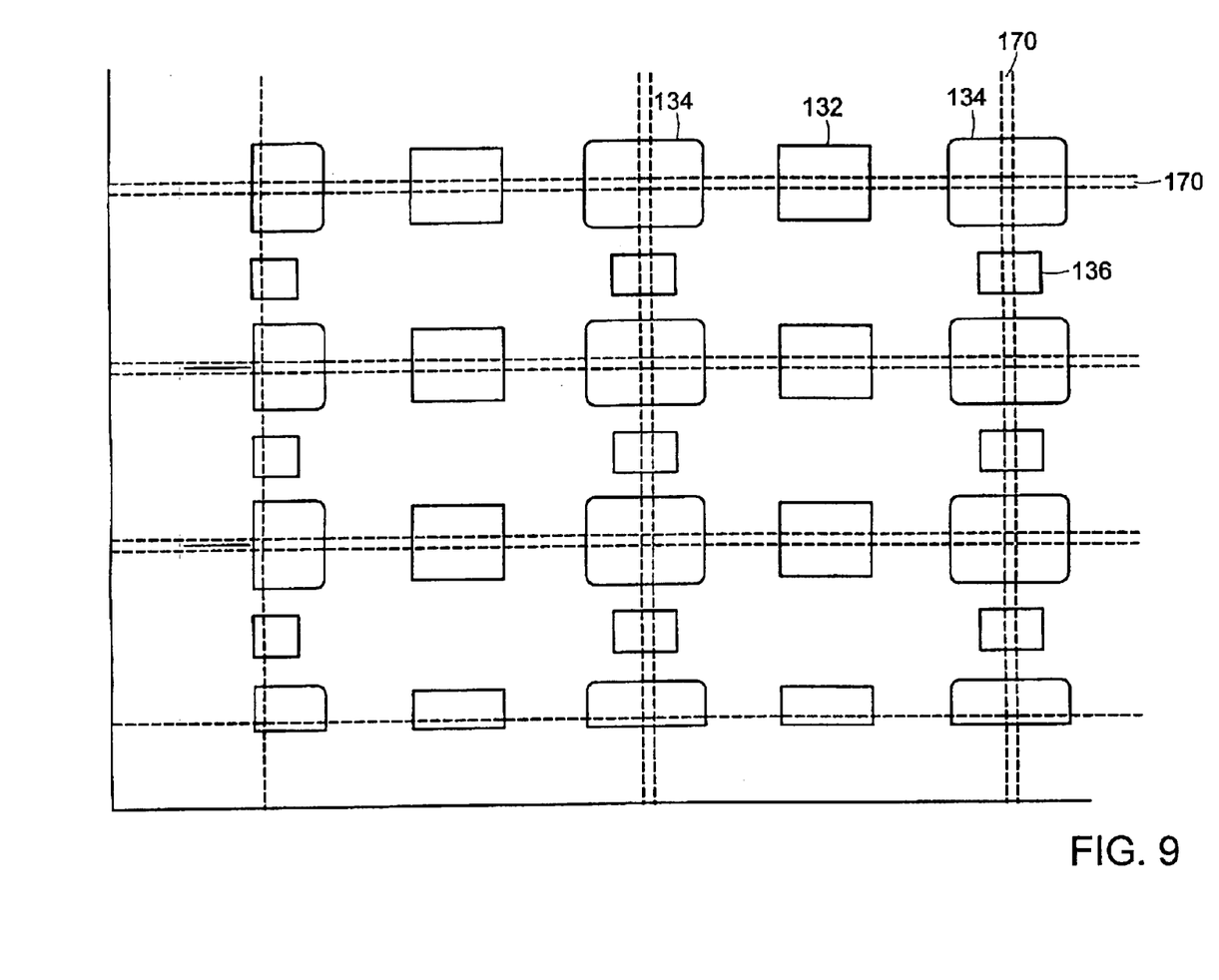
FIG. 9 is an engineering schematic of one embodiment of the present invention, with the hatched lines defining cut sites for dicing a matrix of switches into individual switches. Electrical contacts on the bottom face of the substrate are illustrated.
Figure 10:
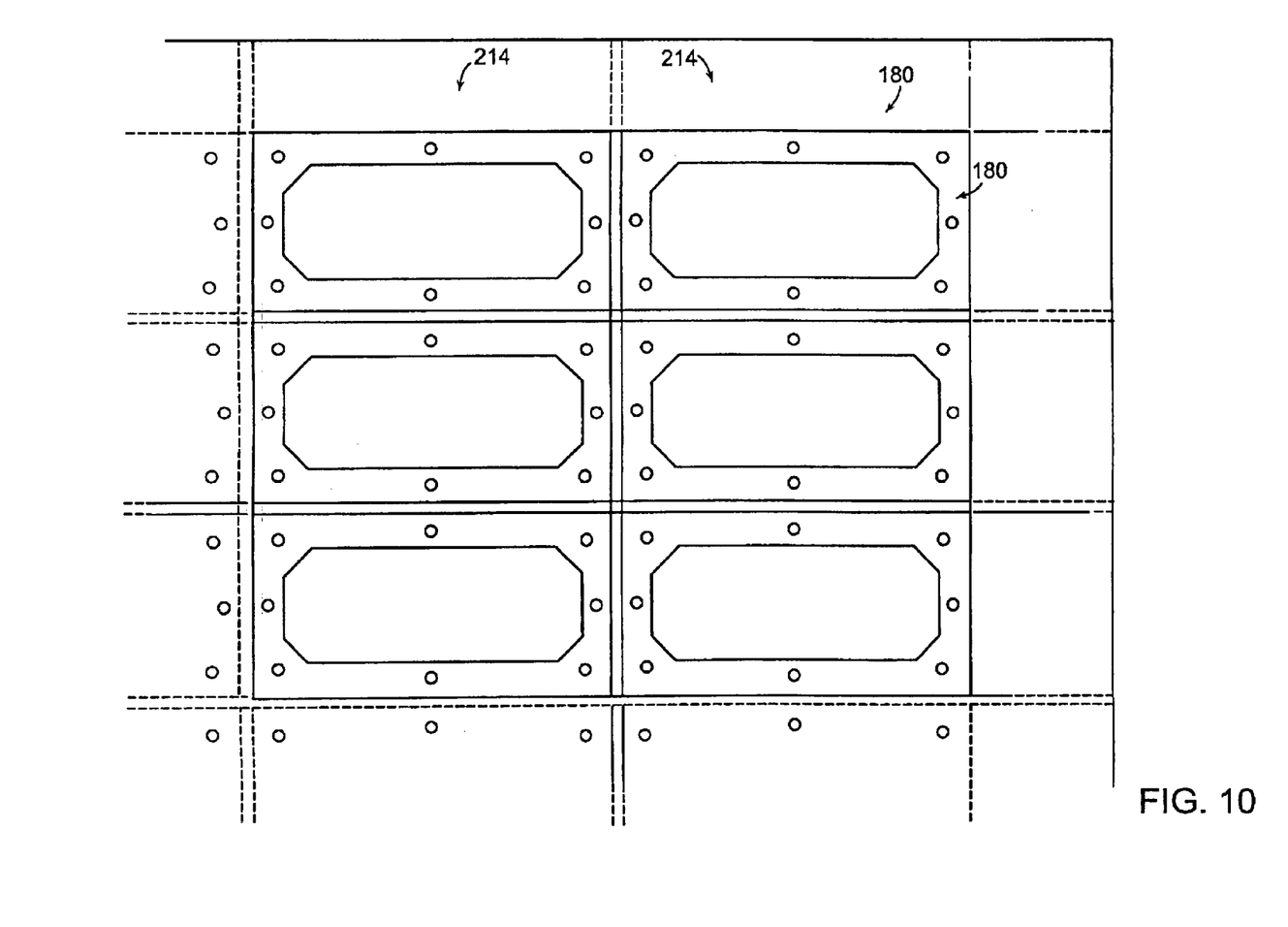
FIG. 10 illustrates a matrix of substrates before dicing. Shown in this embodiment are the plated through holes which will define a conductive pathway through the body of the substrate.
Figure 11:
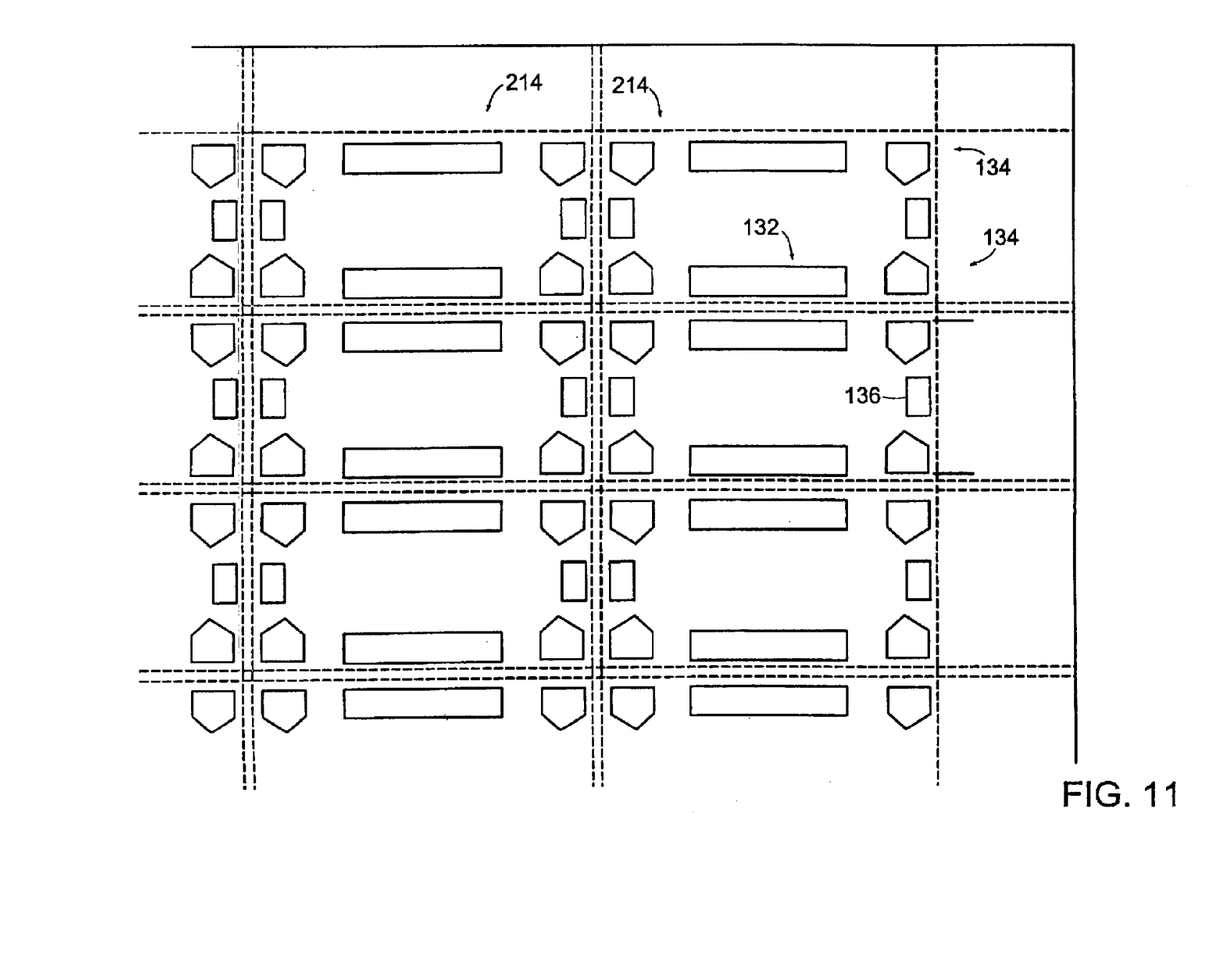
FIG. 11 is an engineering schematic of one embodiment of the present invention, with the hatched lines defining cut sites for dicing a matrix of switches into individual switches. Electrical contacts on the top face of the substrate are illustrated, to which the internal reed switch component will be terminated.
Figure 12:
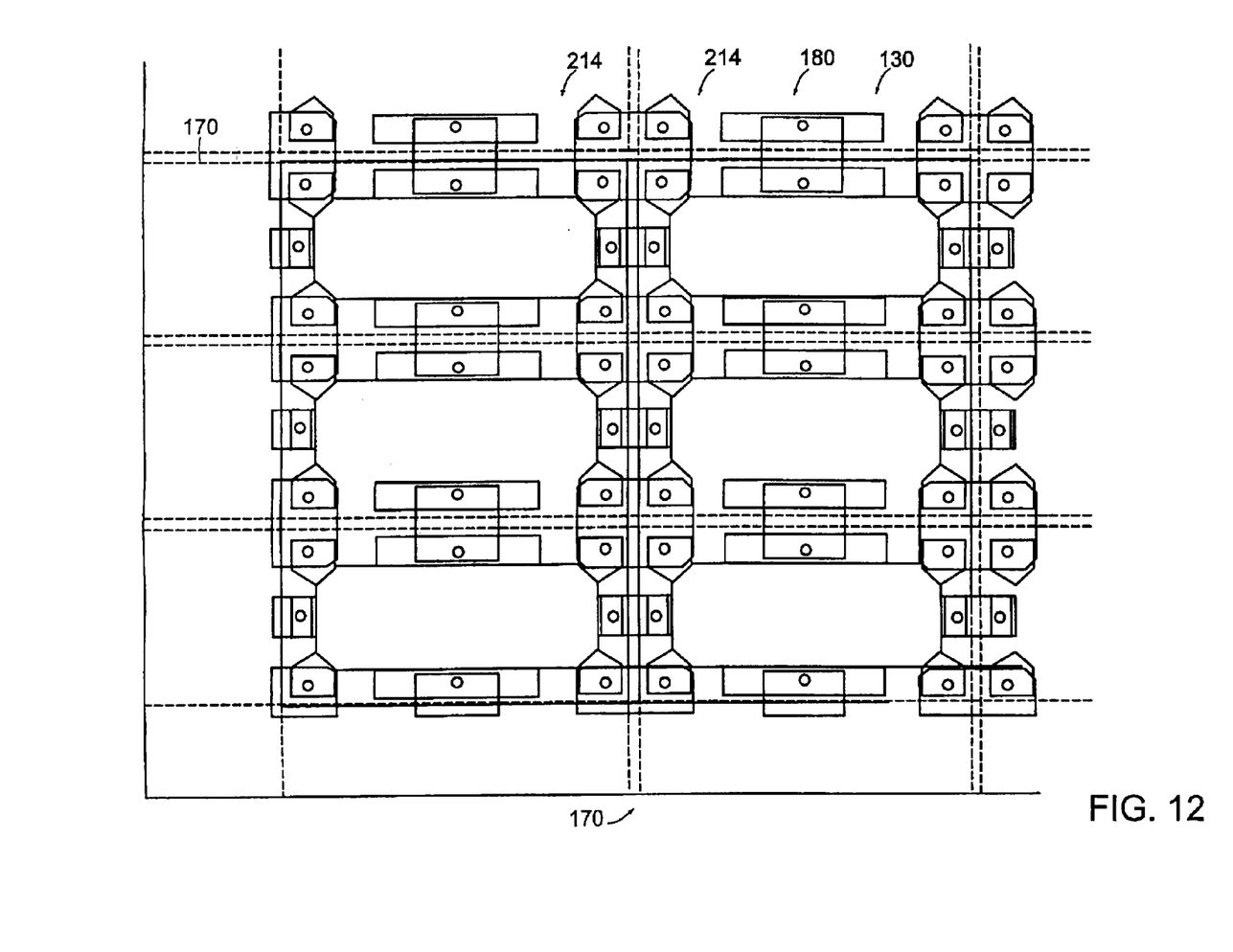
FIG. 12 is an overlay composite drawing of FIG. 9, FIG. 10 and FIG. 11.

FIG. 9, FIG. 10, FIG. 11 and FIG. 12 are engineering schematics of the present invention. The hatched lines 170 define the cut sites for the individual component devices when a matrix of devices is formed according to one embodiment of the invention. As shown in FIG. 9, the contacts 132, 134, and 136 as shown are the external contacts designed to provide an electrically conductive path from the circuit board to respectively, the coil assembly, the shield, and the reed switch (not shown). For ease of manufacture or for enabling the use of an array of such devices, the contacts can overlap across several modules. In FIG. 10, the substrate 214 provides for a matrix of reed switch components before dicing. Plated through holes 180 are formed through the substrate. The holes in this embodiment are designed to provide for vias or a similar conductive pathway between the external and internal contacts in the finished product. In FIG. 11, the substrate 214 again provides for a matrix of reed switch components. The contacts 132, 134 and 136 as shown are the internal contacts, designed to engage respectively the coil assembly, the shield, and the reed switch elements of the internal component (not shown). The terminal edges of the contacts 132, 134 and 136 are offset from the edge of the substrate 214 in this diagram. FIG. 12 is a composite of FIG. 9, FIG. 10 and FIG. 11. The external contacts and internal contacts are generally shown as 130. In this embodiment, the substrate 214 is of a open bottom configuration and defines a central aperture to contain the reed switch device and internal component. The external contact 130 as shown, provides for an offset or relief from the aperture. This enables the over mold process as described herein.

The reed switch module of the present invention comprises one, and more preferably a plurality of reed switch devices. Each reed switch device further comprises a plurality of contact tongues contained in a tube, with the contact tongues terminating in signal leads extending outside the tube. The signal leads are terminated to a plurality of signal contacts. A ground shield conductor is disposed around the exterior of the tube and is terminated to a plurality of ground contacts. A magnetic coil assembly is disposed around the exterior of the ground shield conductor, and the magnetic coil assembly further comprises a coil bobbin and a wire coil wrapped around the coil bobbin. The coil wire is terminated to coil contacts. One or more of the reed switch devices is seated on, contained by, or otherwise disposed on a substrate, which has a main body with a top surface and a bottom surface adapted for the reed switch devices. The reed switch devices are positioned in a manner as to minimize the space they occupy on the substrate, for example, in an array, or as a matrix of switches. On the substrate is a plurality of electrically conductive paths disposed along one or more surfaces in electrical connection to the reed switch device, wherein a plurality of the paths are connected to the signal contacts, a plurality of the paths are connected to the ground contacts, and a plurality of the paths are connected to the coil contacts. These paths are further capable of being connected to a signal line, a ground line, and a magnetic coil line of a circuit. An over mold is disposed on the top surface of the substrate. It contains the internal component, i.e., the reed switch devices. For a surface mount reed switch module, the over mold is recessed from a plurality of sides of the substrate, thereby exposing a portion of the terminals which can be electrically connected to the desired electrical paths in a circuit.

The term "internal component" as used herein, refers to the reed switch assembly or reed sensor assembly, which further comprises a ground shield conductor, a coil bobbin, and a coil. Such reed switches are well known in the art but will be generally be of the following design. The reed switch or sensor is a magnetically activated device typically including a plurality of electrically conductive contact tongues contained within, but offset from each other by a small space, and contained in a hermetically sealed tube, such as a glass tube, that is commonly filled with a protective inert gas or a vacuum. The contact tongues terminate in signal leads extending outside the tube. The reed switch is shielded by a ground shield conductor, typically made of electrically conductive material, for example, brass, tin, gold, aluminum or copper. The ground shield is commonly in a cylindrical configuration, disposed around the body of the reed switch, i.e., the exterior of the tube, and is terminated to a ground path for the device. Surrounding the reed switch and disposed around the exterior of the ground shield conductor is a coil bobbin, typically made from plastic, ceramic, or any other non-conductive material. A coil of conductive wire, such as copper wire, is wrapped around the coil bobbin. The wire coil is terminated to a source of electric current. Current flowing through the wire coil creates a magnetic field, which actuates the reed switch or reed sensor by engaging the contact tongues thereby closing the circuit. A switching source, commonly referred to as a coil driver, can be used to supply intermittent current to the magnetic coil assembly thereby regulating the reed switch device.

As used herein the term "substrate" refers to a solid, electrically non-conductive material that is capable of manufacture by molding or machining, for example ceramic material, or a printed circuit board material such as G10 resin, thermoset plastic, and other solid substantially rigid materials. The choice of material for the substrate will depend on the desired thermal and dielectric characteristics required for a given application. In the currently most preferred embodiment, the substrate is ceramic material. The substrate is of a length and thickness appropriate for containing the internal component. As the technology for producing these reed switch components improves and they become smaller, the invention contemplates that the substrate as described will be capable of containing more reed relays or reed switches. The substrate can be manufactured for production of a single reed switch as an individual switch module or it can be manufactured for the production of a plurality reed switches in a single switch module. In one embodiment the substrate is substantially flat or substantially smooth on both sides. In another embodiment, the substrate comprises a depression on one surface capable of receiving and containing the internal components. In yet another embodiment the edges substrate define a hollow space or an aperture, which is capable of receiving and containing the internal components or a portion thereof. In the currently most preferred embodiment the substrate is ceramic and comprises one or more hollow depressions with a closed bottom surface, each depression capable of receiving and securing or seating a reed switch disposed thereon.

Electrically conductive paths to the reed switch device are provided through, e.g. traces, terminals or vias that extend from the exterior surface into the interior of the reed switch module. These are formed along, across, or through one or more surfaces of the substrate, creating electrical paths to the internal components, i.e., a signal path, a ground path, and a path to the magnetic coil assembly. In a preferred embodiment these paths are formed by a plurality of traces or terminals disposed along one or more surfaces of the substrate, which are in electrical connection to a plurality of contacts, i.e., signal contacts, ground contacts, and magnetic coil contacts. In this embodiment the reed switch device is electrically connected to these contacts. In yet another embodiment, a plurality of pins provide the electrical paths to the internal component and additionally are capable of containing and securing the reed switch device. In yet another embodiment, a plurality of plated through holes are formed through the substrate at locations where it is desirable to form conductive pathways between the interior and exterior of the substrate. The holes are formed by standard techniques known to those skilled in the art, such as, for example, molding the holes when the substrate is formed, machining or drilling the holes, or more preferably fabricating the holes by using a laser. The holes or spaces that extend through the substrate define spaces, which are filled or plated with any electrically conductive substance, for example, gold, tin, aluminum, and other electrically conductive alloys known in the art. Standard through-hole plating techniques may also be used. Such conductive pathways may fill the hole or may only line the surface of the hole. This provides electrically conductive pathways, i.e., vias, from contacts on the exterior surface of the substrate to the signal contacts, the ground contacts, and the coil contacts on the interior surface. In one embodiment, the exterior and interior contacts do not extend to the edge of the substrate, rather some relief or clearance between the edge of the contacts and the edge of the substrate is desirable.

The reed relay or reed sensor assembly is positioned on the top surface of the substrate, preferably in the aforementioned depression or aperture, and is further secured by termination of the reed switch device to the contacts (i.e., the signal contacts, ground contacts, and coil contacts). This is effectuated by any means of electrically connecting two conductors, for example, solder, conductive paste or epoxy, or by a weld. This also provides a signal path through the switch, a grounding path for the ground shield conductor, and an electrical path for actuating the magnetic coil.

The term "over mold" as used herein, refers to a material that is disposed in one or more layers over the reed switch internal component and contacts, thereby insulating or shielding the internal component and contacts. This over mold may further comprise a shielding layer capable of shielding the internal components from external RF signals. In this embodiment, a ground path for the shielding layer is provided. In the currently most preferred embodiment, the over mold is a thermoset plastic resin.

A thermoset over mold is applied to the substrate and internal components in the following manner. The substrate and terminated reed switch devices are positioned in a molding apparatus. The molding apparatus has two surfaces defining a molding space, into which is extruded or poured the molding material. One surface of the molding apparatus is designed to contact the surface of the substrate opposite to the reed switch devices, i.e., an exterior surface. It is desirable to prevent the thermoset mold from covering the contacts or terminals on the exterior surface of the finished module. Accordingly, one surface of the molding apparatus is designed such that it presents a small raised surface, approximately the thickness of the contacts on the exterior surface of the substrate. As the contacts are slightly offset from the edge of the substrate aperture, the raised surface is designed to be capable of engaging the substrate at the terminal edges of the contacts, thereby effectuating a seal across the bottom of the substrate aperture. The other surface of the mold (i.e., the surface that will engage the top or internal surface of the finished module) defines a head-space which provides clearance for the reed switch internal components, and clearance at positions where the contacts or terminals are located, the clearance of approximately the thickness of the contacts, and is elsewhere in direct contact with the substrate surface. With the mold surfaces engaging and containing the substrate and internal components, a mold material is incorporated into the mold. In one embodiment the edges of the mold surface engage directly the perimeter of the substrate, thereby effectuating a seal across the entire top surface of the substrate. This type of process is designed to produce a switch module adapted for surface mounting where the electrical path into the module is effectuated by the contacts on the exterior surface of the module. In the currently most preferred embodiment, the over mold process is designed such that it is offset from a plurality of edges of the top surface of the substrate which provides relief along these edges. In this embodiment the terminals are only partially covered along their length by the over mold.

The finished reed relay switch or reed sensor as described is a self-contained module having a monolithic structure and is substantially lead-less. The device is capable of being directly mounted on the surface of, for example, a component board through conventional surface mount technology. The currently preferred embodiment of the present invention enables the production of an array of reed relay or reed sensor modules. The array can be diced to produce individual modules or more preferably a module comprising a plurality of reed relays or reed sensors. The finished reed switch modules are substantially lead-less and are capable of being surface mounted.

The invention encompasses the inclusion of coil drivers into the reed switch module, for example, one or more integrated circuit drivers connected to a serial input to turn off/on banks of reed switches or relays. In a preferred embodiment, a single serial line is desirable to reduce the need for external termination. The coil driver may be onboard, i.e., mounted on the exterior surface of the switch module or may be outboard. The position of the coil driver depends on the application of the switch module, and the physical specifications required by the device incorporating the switch module.

There are many applications for a surface mount reed switch of the present invention. One embodiment contemplates the use of this device in, for example, automatic test equipment integrated circuit testers requiring switching devices having high insulation resistance (typically greater that $10^{12}$ Ohms), and the ability to switch and carry fast pulses and high frequencies into the microwave range. Such automatic test equipment containing reed switches of the present invention have applications in printed wiring board testing, and other environments where high frequencies and/or fast digital pulses are switched and/or carried. In a preferred embodiment, the invention enables the use of the device for switching and carrying radio frequency (RF) signals at a frequency of at least 10 GHz and switching and carrying fast digital pulses with clock speeds of at least 3 GHz where pulse rise times of at least 50 picoseconds are not substantially distorted or substantially slewed by the reed switch.

In another embodiment, the reed switch of the present invention is used as an attenuator, where high frequencies and/or fast digital pulses are switched through a plurality of reed switch attenuators thereby reducing signal levels in an incremental way. Reed relay switches of the present design are not susceptible to intermodulation distortion as would be semiconductors switching the same high frequency signals.

Another embodiment of the invention contemplates usage in telecommunications circuits as transmit/receive switches. Battery operated devices, for example, employ the reed switch device where a single pole double throw reed relay in the de-energized position (non-power drawing position) will receive incoming signals with no power draw. Energizing the relay would initiate, for example, transmission of high frequencies on the normally open side of the relay. Further examples of use for this invention are in, for example but not limited to, personal digital assistant devices, two-way pagers, and cellular telephones. The reed relays of the present invention have application for example, in antenna switching in cellular phones, where a single pole double throw reed relay in automobiles can switch to the antenna of the auto when the cellular phone is in a holstered position in the auto. Here the relay will be in the energized position, where the cellular phone is powered by the automobile battery power. When the cellular phone is removed from the holster, the relay is de-energized and switches to the cellular phone antenna, where the relay then draws virtually no power. This eliminates battery draw from the cellular phone thereby prolonging the usable battery life. For comparison, semiconductor switches require continuous power draw, using valuable current from the battery in the standby mode. In the present invention, signal insertion loss of the reed relay at 900 MHz is only about 0.1 dB.

The package of the present may be easily modified to accommodate more than one reed switch at a time to provide multiple channels. In this arrangement, the appropriate solder ball interconnections are employed for each reed switch corresponding to a given channel. Further, may different types of interconnections may be employed by the package of the present invention. While it is preferred to employ solder balls in a BGA (ball grid array) package for electric interconnection to a circuit board, other types of interconnections may be employed such as pin grids or land grids. Further, ball grid array socket arrangement may be used to facilitate removal or replacement of the package when desired.

It would be appreciated by those skilled in the art that various changes and modifications can be made to the illustrated embodiments without departing from the spirit of the present invention. Further modifications may be realized by one skilled in the art. Such modifications are within the scope of this disclosure. All such modifications and changes are intended to be covered by the appended claims.

What is claimed is:

1. A reed switch module, comprising:
   a reed switch device further comprising a plurality of contact tongues merged in a tube, the contact tongues terminating in signal leads extending outside the tube, a ground shield conductor disposed around the exterior of the tube, and a magnetic coil assembly disposed around the exterior of the ground shield conductor, said magnetic coil assembly further comprising a coil bobbin and a wire coil wrapped around the coil bobbin;

a substrate having a main body with a top surface and a bottom surface, said reed switch device being disposed on said substrate;

a plurality of contacts on the top surface of said substrate engaging the signal leads, the around shield conductor and the wire coil of the reed switch device and a plurality of contacts on the bottom surface of said substrate, said plurality of contacts on the top surface and said plurality of contacts on the bottom surface connected through electrically conductive paths; and an over mold being disposed on the top surface of the substrate and containing the reed switch device.

2. The reed switch module of claim 1 wherein said substrate is made of dielectric material.

3. The reed switch module of claim 1 wherein said substrate is made of ceramic material.

4. The reed switch module of claim 1 wherein said substrate comprises a depression on one surface capable of receiving and seating said reed relay, shield, coil bobbin, and coil.

5. The reed switch module of claim 1 wherein said substrate defines a hollow space capable of receiving and seating said reed switch, shield, coil bobbin, and coil.

6. The reed switch device of claim 1 wherein said device is maintains a high frequency response while carrying radio frequency signals at a frequency of at least 10 GHz.

7. The reed switch device of claim 1 wherein said device is capable of carrying fast digital pulses with clock speeds of at least 3 GHz, where pulse rise times of at least 30 picoseconds to at least 50 picoseconds are substantially not distorted or slowed.

8. A reed switch module, comprising:

a reed switch device further comprising a plurality of contact tongues merged in a tube, the contact tongues terminating in signal leads extending outside the tube, a ground shield conductor disposed around the exterior of the tube, a magnetic coil assembly disposed around the exterior of the ground shield conductor, said magnetic coil assembly further comprising a coil bobbin and a wire coil wrapped around the coil bobbin;

a substrate having a main body with a top surface and a bottom surface, said reed switch device being disposed on said substrate;

a plurality of contacts on the top surface of said substrate engaging the signal leads, the ground shield conductor and the wire coil of the reed switch device and a plurality of contacts on the bottom surface of said substrate, said plurality of contacts on the top surface and said plurality of contacts on the bottom surface connected through electrically conductive paths; and an over mold being disposed on the top surface of the substrate and containing the reed switch device, said over mold recessed from a plurality of sides of said substrate.

9. The reed switch module of claim 8 wherein the electrically conductive paths are partially covered by the over mold and the exposed regions are adapted for surface mounting of the reed switch module to a circuit board.

10. The reed switch module of claim 9 wherein the over mold of the module is contained within a hole in a circuit board and the profile of the module on the circuit board is reduced.

11. The reed switch module of claim 8 wherein said electrically conductive paths are connected to a signal line, a ground line, and a magnetic coil line of a circuit.

12. The reed switch module of claim 8 wherein said electrically conductive paths are selected from the group consisting of traces, terminals, vias and pins.

13. The reed switch module of claim 8 wherein said electrically conductive paths are terminals.

14. The reed switch module of claim 8 wherein said electrically conductive paths are pins.

15. The reed switch module of claim 8 wherein said substrate is substantially thin and flat on both surfaces and said electrically conductive paths are pins in electrical connection with the signal leads, the ground shield conductor, and the magnetic coil assembly of said reed switch device.

16. The reed switch module of claim 1 wherein said electrically conductive paths are connected to a signal line, a ground line, and a magnetic coil line of a circuit.

17. The reed switch module of claim 1 wherein said electrically conductive paths are selected from the group consisting of traces, terminals, vias and pins.

18. The reed switch module of claim 1 wherein said electrically conductive paths are terminals.

19. The reed switch module of claim 1 wherein said electrically conductive paths are pins.

20. The reed switch module of claim 1 wherein said substrate is substantially thin and flat on both surfaces and said electrically conductive paths are pins in electrical connection with the signal leads, the ground shield conductor, and the magnetic coil assembly of said reed switch device.

21. A reed switch module comprising:

a reed switch device further comprising a plurality of contact tongues in a tube, the plurality of contact tongues terminating in a plurality of signal leads extending outside the tube, the plurality of signal leads connected to a plurality of signal contacts, a ground shield conductor disposed around the tube and connected to a plurality of ground contacts, and a magnetic coil assembly disposed around the ground shield conductor, the magnetic coil assembly further comprising a wire wrapped around a coil bobbin where the wire is connected to coil contacts;

a substrate having a top surface, a bottom surface, and a depression in the top surface for receiving the reed switch device; and a plurality of contacts on the top surface of the substrate engaging the plurality of signal leads, the ground shield conductor and the wire of the reed switch device and a plurality of contacts on the bottom surface of the substrate, the plurality of contacts on the top surface and the plurality of contacts on the bottom surface connected through electrically conductive paths.

22. The reed switch module of claim 21 wherein said electrically conductive paths are connected to a signal line, a ground line, and a magnetic coil line of a circuit.

23. The reed switch module of claim 21 wherein said electrically conductive paths are selected from the group consisting of traces, terminals, vias and pins.

* * * * *